(12) United States Patent
Ueno

(10) Patent No.: US 6,399,256 B1
(45) Date of Patent: Jun. 4, 2002

(54) RETICLE HAVING ACCESSORY PATTERN DIVIDED INTO SUB-PATTERNS

(75) Inventor: Hisanori Ueno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/453,709

(22) Filed: Dec. 3, 1999

(30) Foreign Application Priority Data

Dec. 3, 1998 (JP) .......................................... 10/344667

(51) Int. Cl.$^7$ ................................................ G03F 9/00
(52) U.S. Cl. ........................................................ 430/5
(58) Field of Search ............................. 430/5, 311, 312, 430/313

(56) References Cited

U.S. PATENT DOCUMENTS

| | | | |
|---|---|---|---|
| 4,388,386 A | 6/1983 | King et al. | |
| 4,530,604 A | 7/1985 | Okutsu et al. | |
| 4,590,382 A | 5/1986 | Tabata | |
| 5,017,514 A | * 5/1991 | Nishimoto | 430/5 |
| 5,601,957 A | 2/1997 | Mizutani et al. | |
| 5,888,674 A | * 3/1999 | Yang et al. | 430/5 |
| 5,932,376 A | * 8/1999 | Lin et al. | 430/5 |
| 6,099,992 A | * 8/2000 | Motoyama et al. | 430/5 |

FOREIGN PATENT DOCUMENTS

| | | |
|---|---|---|
| EP | 0 841 594 A2 | 5/1998 |
| GB | 2314941 A | 1/1998 |
| JP | 60-202933 | 10/1985 |
| JP | 64-13945 | 1/1989 |
| JP | 64-50420 | 2/1989 |
| JP | 3-18851 | 1/1991 |
| JP | 3-77309 | 4/1991 |
| JP | 7-14931 | 1/1995 |
| JP | 9-55481 | 2/1997 |
| JP | 10/242427 | 9/1998 |

OTHER PUBLICATIONS

Japanese Office Action dated May 15, 2001, with partial English translation.

* cited by examiner

Primary Examiner—S. Rosasco
(74) Attorney, Agent, or Firm—McGinn & Gibb, PLLC

(57) ABSTRACT

In a reticle for transferring a pattern onto a photosensitive layer by a photolithography process, the reticle has a principal pattern and an accessory pattern, and the accessory pattern is divided into a set of continuously arranged sub-patterns.

25 Claims, 15 Drawing Sheets

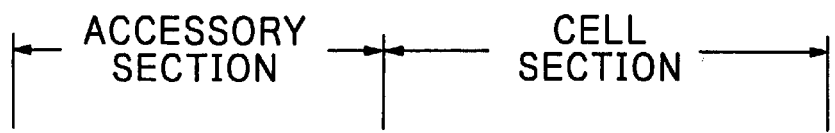
Fig. 3A
PRIOR ART
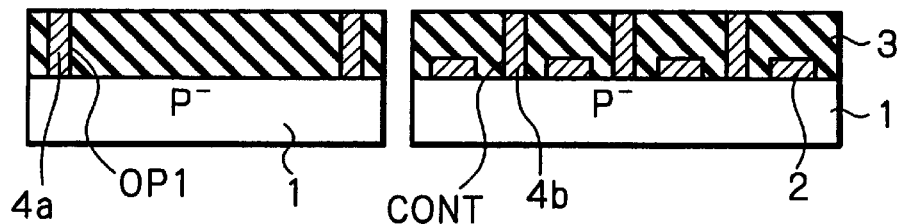
Fig. 3B
PRIOR ART
Fig. 3C
PRIOR ART
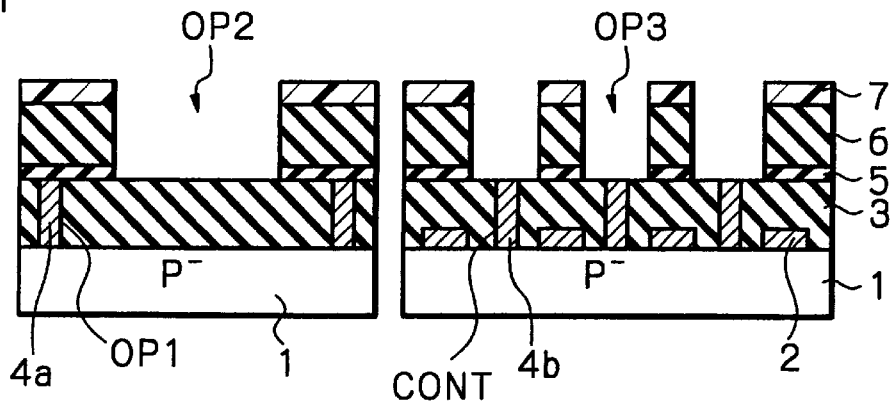

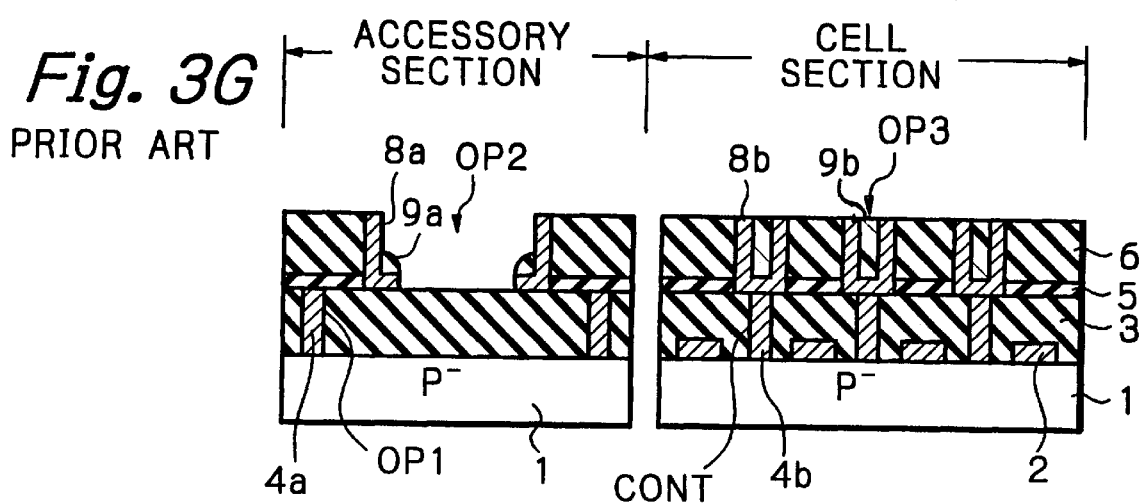
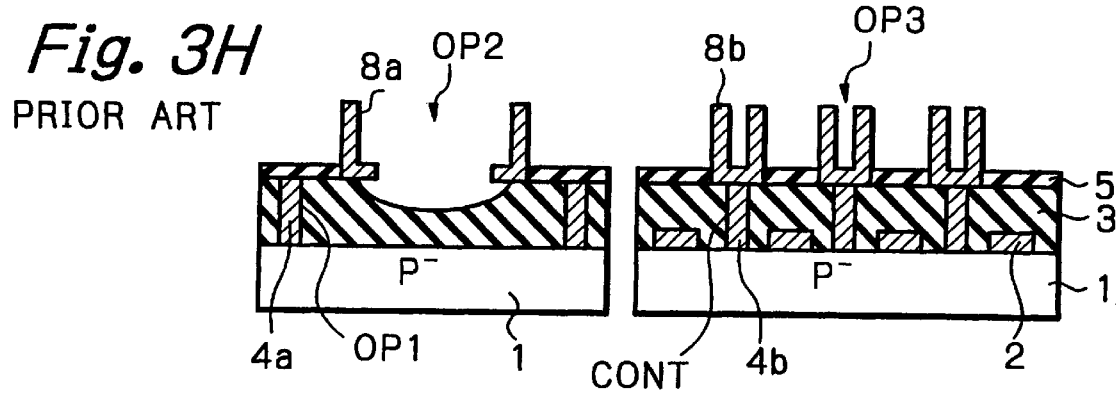
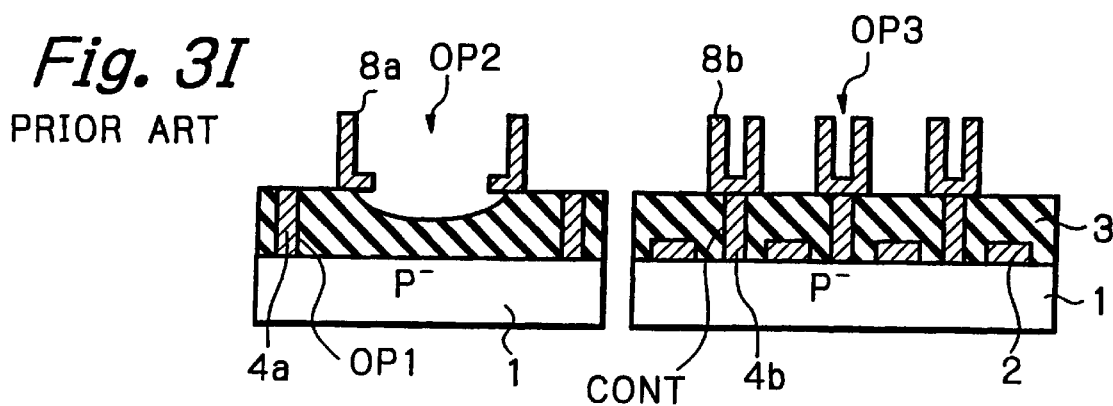

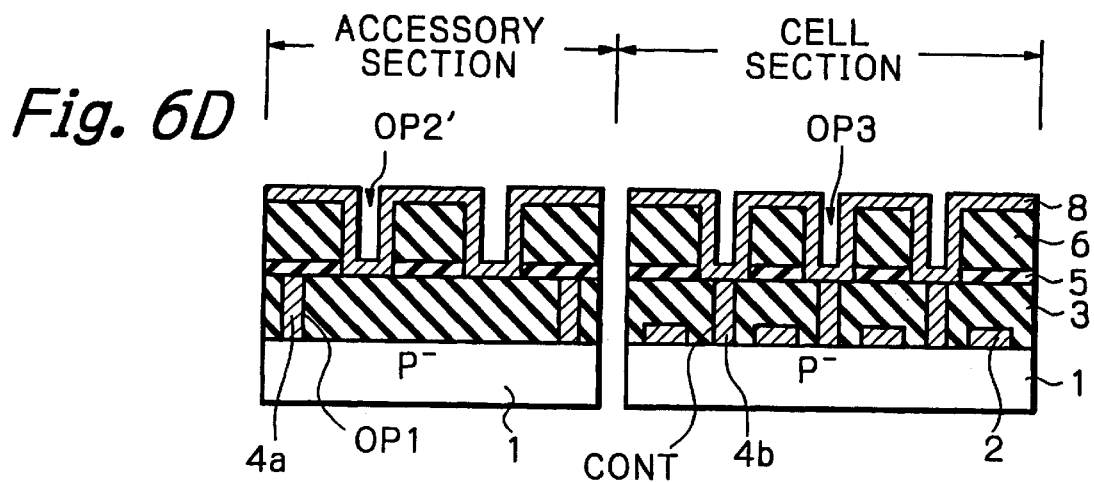
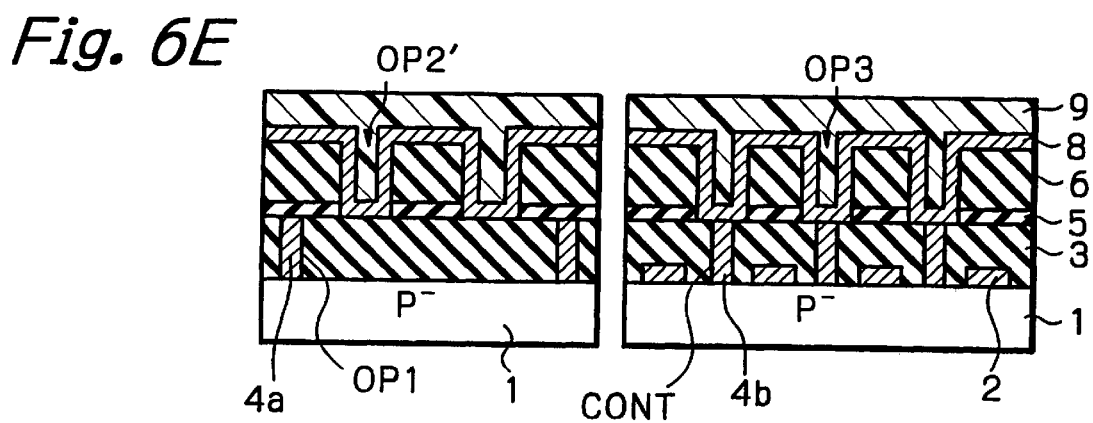
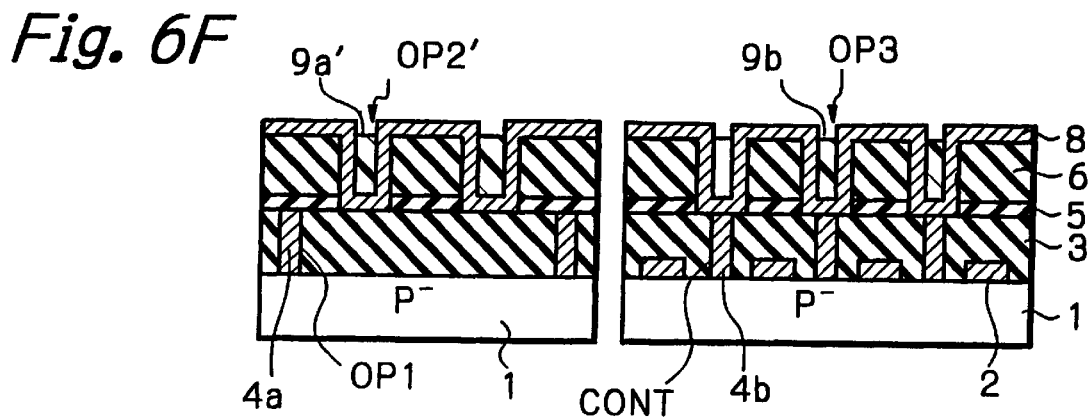

RETICLE HAVING ACCESSORY PATTERN DIVIDED INTO SUB-PATTERNS

BACKGROUND OF THE INVENTION

1. Field of the Invention

The present invention relates to a reticle and a method for manufacturing a semiconductor device using such a reticle.

2. Description of the Related Art

In the course of manufacturing a semiconductor device, a semiconductor device is subjected to a large number of patterning steps. In the patterning steps, patterns of the semiconductor device are prepared by means of reticles that carry thereon corresponding patterns that are different from each other. Therefore, it is important that the pattern prepared on the semiconductor device in the current step and the pattern prepared on the semiconductor device in a preceding step are aligned relative to each other with an high degree of accuracy.

For the purpose of accurately aligning patterns, an alignment mark for aligning itself with its counterpart formed on the semiconductor device in a preceding step, an alignment-accuracy gauging pattern for gauging the accuracy of alignment or a dimension gauging pattern for gauging the dimension of the prepared reticle is typically formed on a reticle along with a principal pattern to be used for manufacturing the semiconductor device. Such a pattern is made so as to form a profile specifically adapted to the purpose for which it is used. Generally, a pattern that is used for a purpose other than producing a semiconductor device is referred to as an accessory pattern and formed inside a dicing area arranged in a peripheral area of chip area, i.e., a principal pattern forming region that is cut off when producing a chip.

A prior art reticle has an accessory pattern whose width is much greater than a minimum width of a principal pattern of the chip area. This will be explained later in detail. As a result, a pattern layer formed by the accessory pattern may be peeled off. If this peeling-off phenomenon occurs, it is no longer possible to gauge the accuracy of alignment in a subsequent patterning step and the peeling off of the pattern layer can shed particles in subsequent manufacturing steps, thus reducing the manufacturing yield.

SUMMARY OF THE INVENTION

It is an object of the present invention to provide a reticle capable of reducing the peeling-off phenomenon of a pattern layer formed by the reticle.

Another object is to provide a method for manufacturing a seminconductor device by using such a reticle.

According to the present invention, in a reticle for transferring a pattern onto a photosensitive layer by a photolithography process, the reticle has a principal pattern and an accessory pattern, the accessory pattern being divided into a set of continuously arranged sub-patterns.

BRIEF DESCRIPTION OF THE DRAWINGS

The present invention will be more clearly understood from the description set forth below, as compared with the prior art, with reference to the accompanying drawings, wherein:

FIGS. 3A through 3I are cross-sectional views for explaining a prior art method for manufacturing a semiconductor device;

FIGS. 6A through 6I are cross-sectional views for explaining an embodiment of the method for manufacturing a semiconductor device according to the present invention;

DESCRIPTION OF THE PREFERRED EMBODIMENTS

Before the description of the preferred embodiments, prior art accessory patterns and a prior art method for manufacturing a semiconductor device will be explained with reference to FIGS. 1, 2A, 2B, 2C, 3A through 3I, 4A and 4B.

Figure 1:
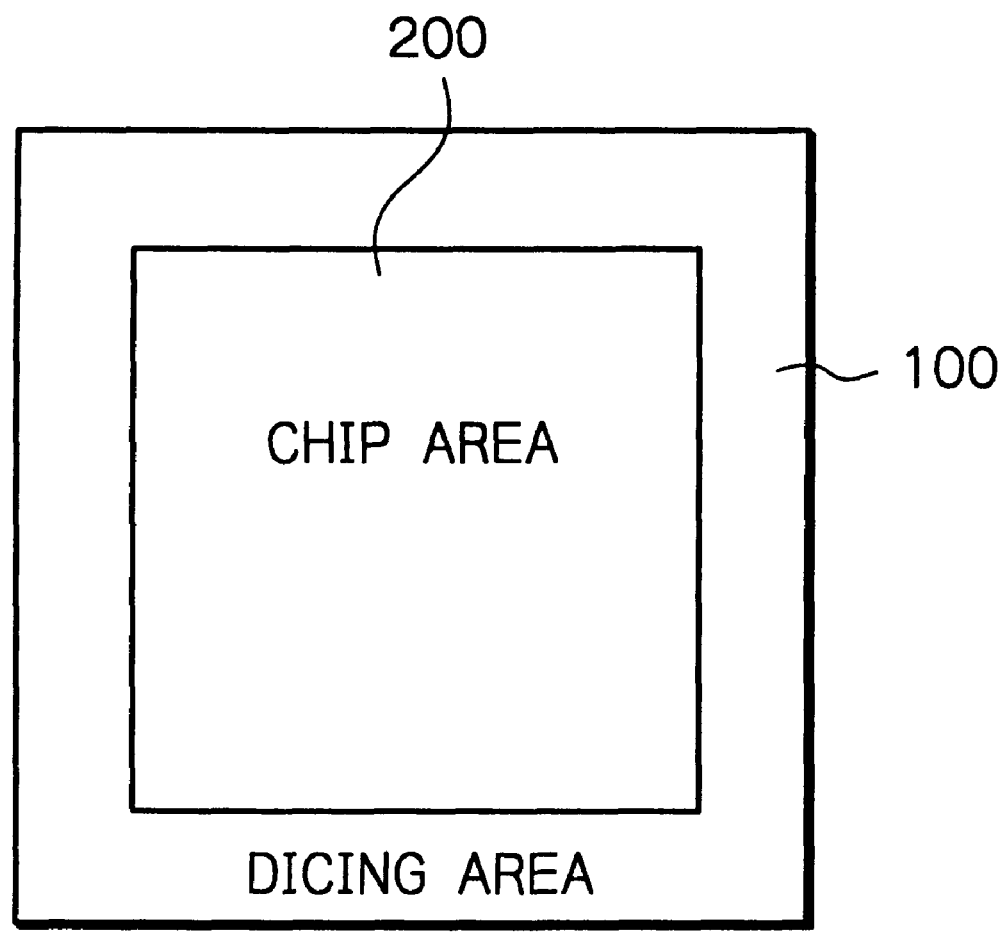
FIG. 1 is a plan diagram illustrating a prior art reticule.

In FIG. 1, which is a plan view illustrating a prior art reticle, a dicing area 100 surrounds a chip area 200 where active elements such as memory cells and peripheral circuits are formed. Accessory patterns are formed in the dicing area 100.

Figure 2A:
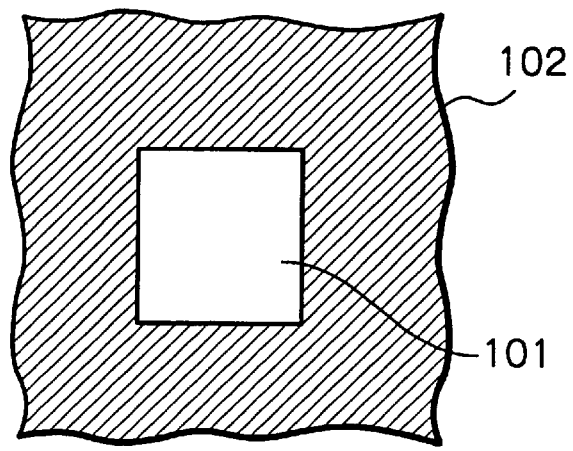
FIGS. 2A, 2B and 2C are plan views of the accessory patterns of the reticle of FIG. 1.
Figure 2B:
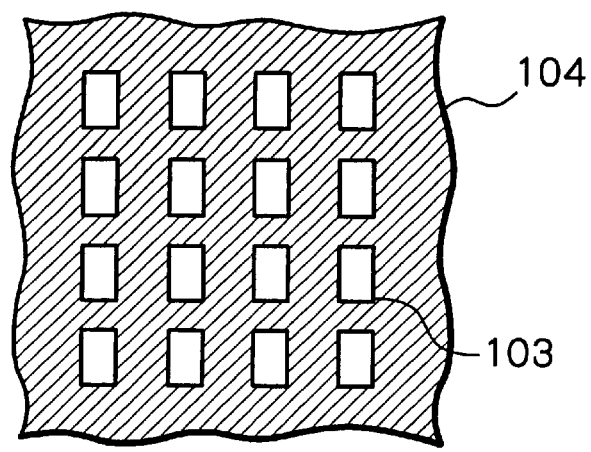
Figure 2C:
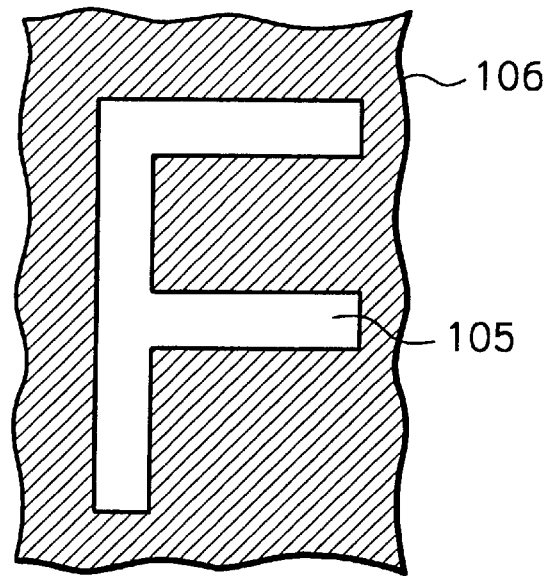

FIGS. 2A, 2B and 2C are plan views of the accessory patterns of FIG. 1. In FIG. 2A, the accessory pattern is an alignment-accuracy gauging pattern formed by a rectangular light transmitting region 101 and a light shield region 102 surrounding the rectangular light transmitting region 101. In FIG. 2B, the accessory pattern is an alignment mark formed by a plurality of rectangular light transmitting regions 103 and a light shield region 104 surrounding the rectangular light transmitting regions 103. In FIG. 2C, the accessory pattern is a dimension gauging pattern formed by an F-shaped light transmitting region 105 and a light shield region 106 surrounding the F-shaped light transmitting region 105. Each of the accessory patterns of FIGS. 2A, 2B and 2C has a width of several micrometers to tens of several micrometers.

A prior art method for manufacturing a cylindrical stacked capacitor type DRAM cell using the alignment-accuracy gauging pattern of FIG. 2A is explained next with reference to FIGS. 3A through 3I, 4A and 4B. In each of FIGS. 3A through 3I, the left view indicates an accessory section located in the dicing area 100 of FIG. 1 and the right view indicates a cylindrical stacked capacitor memory cell section in the chip area 200 of FIG. 1.

First, referring to FIG. 3A, a field silicon oxide layer and a gate silicon oxide layer (not shown) are grown by thermally oxidizing a P-type monocrystalline silicon substrate 1. Then, a polycrystalline silicon layer is deposited by a chemical vapor deposition (CVD) process, and the polycrystalline silicon layer is patterned by a photolithography and etching process to obtain a gate electrode layer 2. Then, N-type impurities are implanted into the silicon substrate 1 in self-alignment with the gate electrode layer 2 to form source/drain diffusion regions (not shown) within the silicon substrate 1. Then, a silicon oxide layer 3 is deposited on the entire surface by a CVD process. Then, a strip-like opening OP1 and a contact hold CONT are formed in the accessory section and the cell section, respectively, of the silicon oxide layer 3. In this case, the strip-like opening OP1 is formed by a photolithography process using an alignment-accuracy gauging pattern reticle as illustrated in FIG. 4A. Then, a polycrystalline silicon layer is deposited on the entire surface by a CVD process, and the polycrystalline silicon layer is etched back. As a result, an alignment-accuracy gauging pattern in layer 4a and a contact plug 4b are buried in the strip-like opening OP1 and the contact hole CONT, respectively, of the silicon oxide layer 3.

Next, referring to FIG. 3B, an about 50 nm thick silicon nitride layer 5 is deposited on the entire surface by a CVD process, and an about 700 nm thick doped silicon oxide layer 6 made of boron-doped phosphorus silicated glass (BPSG) is deposited on the silicon nitride layer 5 by a CVD process. Note that the silicon nitride layer 5 serves as an etching stopper when the doped silicon oxide layer 6 is etched by a wet etching process. Then, a positive-type photoresist layer 7 is coated and patterned by a photolithography process. Note that the positive-type photoresist layer 7 can be dissolved into a developing solution when irradiated with light. In this case, the photoresist layer 7 is patterned by a photolithography process using an alignment-accuracy gauging pattern reticle as illustrated in FIG. 4B, which is the same as FIG. 2A. For the alignment operation of the reticle of FIG. 4B, the alignment-accuracy gauging pattern layer 4a is used.

Next, referring to FIG. 3C, the doped silicon oxide layer 6 is etched by a dry etching process using fluorocarbon gas such as $CF_4$ or $CHF_3$ and the photoresist layer 7 as a mask. Then, the silicon nitride layer 5 is further etched by a dry etching process using fluorocarbon gas such as $CF_4$ or $CHF_3$ to expose the silicon oxide layer 3. As a result, a square opening OP2 is formed in the silicon nitride layer 5 and the doped silicon oxide layer 6 of the accessory section, and openings OP3 are formed in the silicon nitride layer 5 and the doped silicon oxide layer 6 of the cell section. Then, the photoresist layer 7 is removed.

Figure 3D:
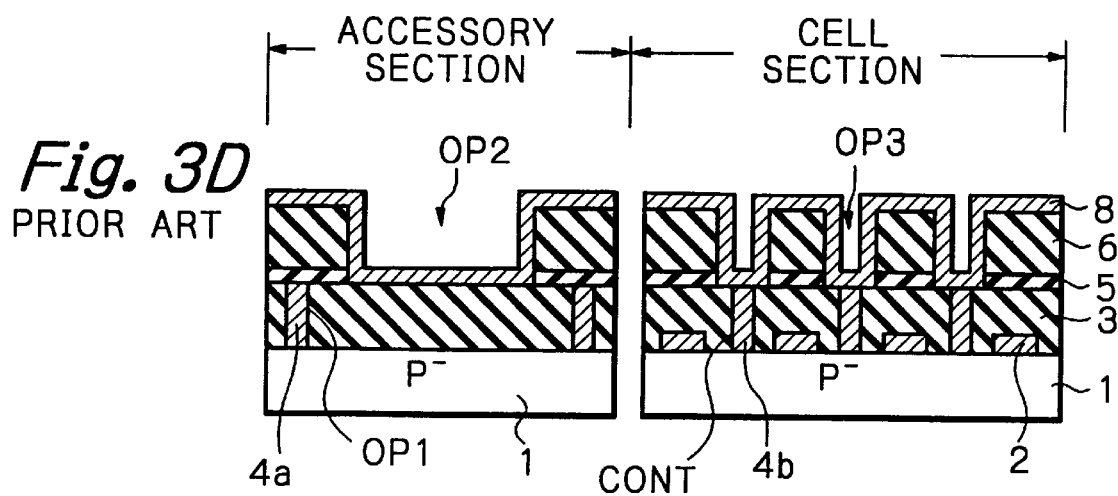
Figure 4A:
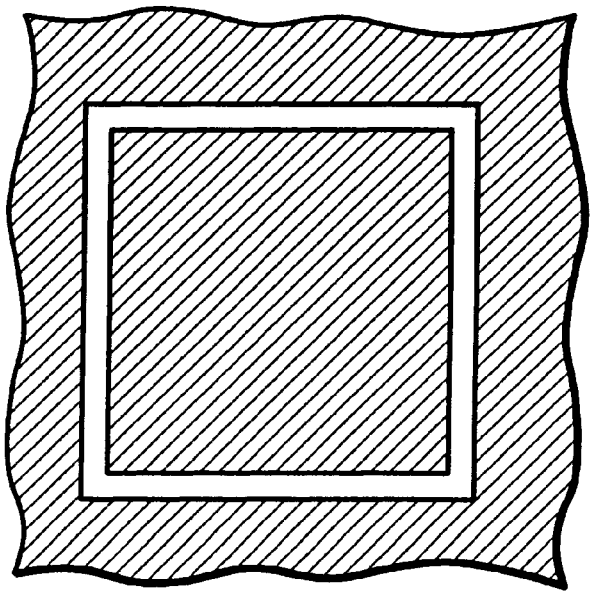
FIGS. 4A and 4B are plan views of reticles used in the steps of FIGS. 3A and 3B, respectively.
Figure 4B:
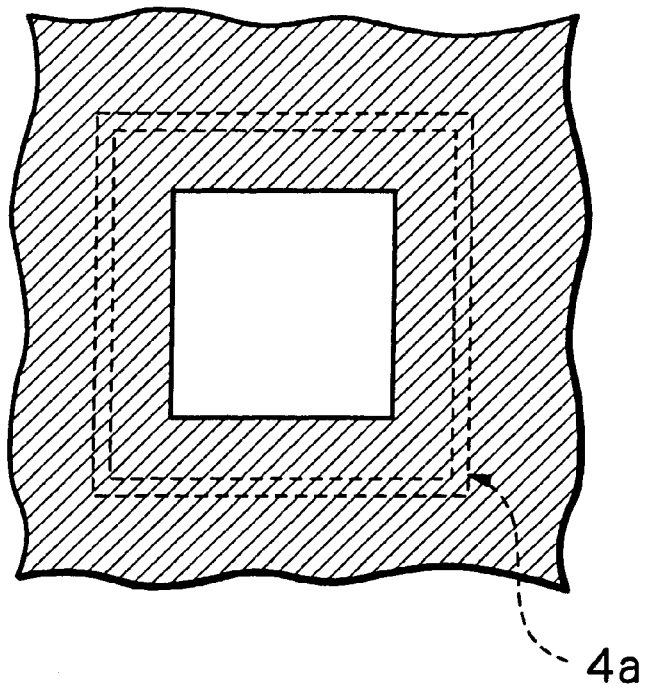

Next, referring to FIG. 3D, an about 100 nm thick polycrystalline silicon layer 8 is deposited on the entire surface by a CVD process. In this case, the thicknes of the polycrystalline silicon layer 8 is so small that the polycrystalline silicon layer 8 covers the openings OP2 and OP3.

Figure 3E:
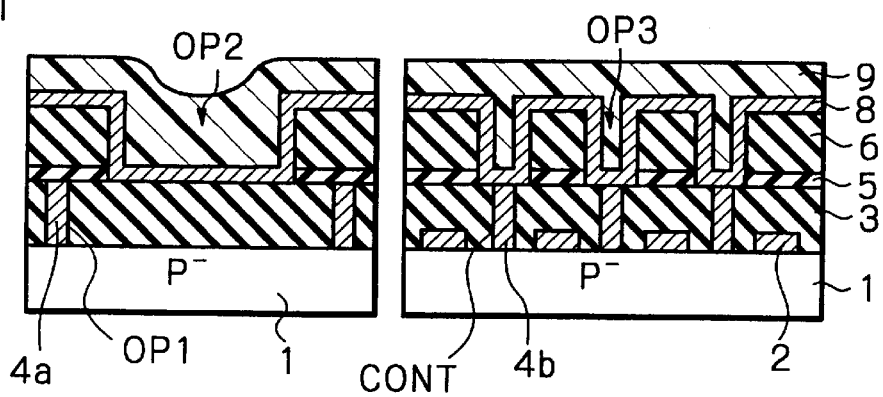

Next, referring to FIG. 3E, an organic or inorganic layer 9 is coated on the entire surface, so that the organic or inorganice layer 9 is buried in the openings OP2 and OP3 of the accessory section and the cell section, respectively. In this case, since the opening OP2 in the accessory section is sufficiently large, the surface of the organic or inorganic layer 9 is concave. On the other hand, since the opening OP3 in the cell section is sufficiently small, the surface of the organic or insulating layer 9 is flattened.

Note that the organic or inorganic layer 9 is made of spin on glass (SOG) or a photoresist material.

Figure 3F:
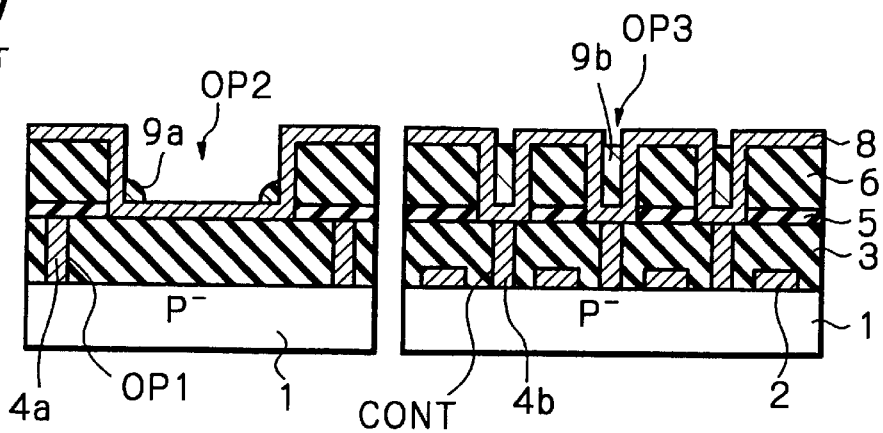

Next, referring to FIG. 3F, the organic or inorganic layer 9 is etched back by a dry etching process using fluorocarbon gas such as $CF_4$ or $CHF_3$ to expose the polycrystalline silicon layer 8. In this case, since the opening OP2 in the accessory section serving as the accessory pattern has a size of several to tens of several micrometers larger than the capacitor size of 0.2 to 1 micrometers essentially none of the organic or inorganic layer 9 will remain on the bottom of the opening OP2; only an organic or inorganic layer 9a will remain on the edges of the opening OP2. On the other hand, since the opening OP3 in the cell section, which is a polygonal recess whose sides have a length corresponding to the capacitor size of 0.2 to 1 micrometers, has only a small area, an organic or inorganic layer 9b remains in the opening OP3 to a considerable extent. The organic or inorganic layer 9b serves as a protection layer for preventing the polycrystalline silicon layer 8 from being etched back.

Next, referring to FIG. 3G, the polycrystalline silicon layer 8 is etched back by using chlorine gas. As a result, a polycrystalline silicon layer 8a in the accessory section remains on the sidewall of the silicon nitride layer 5 and the doped silicon oxide layer 6 within the opening OP2. On the other hand, an U-shaped polycrystalline silicon layer 8b in the cell section remains in the opening OP3 to form a lower capacitor electrode.

Next, referring to FIG. 3H, the organic or inorganic layers 9a and 9b in the openings OP2 and OP3 and the doped silicon oxide layer 6 are removed by a wet etching process using fluoric acid while the silicon nitride layer 5 serves as an etching stopper.

Finally, referring to FIG. 3I, the silicon nitride layer 5 is removed by a dry etching process using fluorocarbon gas such as $CF_4$ or $CHF_3$.

In the manufacturing method as illustrated in FIGS. 3A through 3I, however, when the wet etching process for etching the organic or inorganic layers 9a and 9b and the doped silicon oxide layer 6 as illustrated in FIG. 3H, the silicon oxide layer 3 at the opening OP2 is also etched. As a result, as illustrated in FIG. 3I, the polycrystalline silicon layer 8a can lift and peel off.

Because of this peeling-off phenomenon, it is no longer possible to gauge the accuracy of alignment in a subsequent patterning step and the polycrystalline silicon layer 8a may shed particles in the subsequent manufacturing steps, thereby reducing the manufacturing yield.

While the phenomenon of a peeling polycrystalline silicon layer 8a may be prevented by adding a step of protecting only the accessory section by means of a photoresist layer, this inevitably entails an increased number of manufacturing steps and a rise in the manufacturing cost.

Figure 5A:
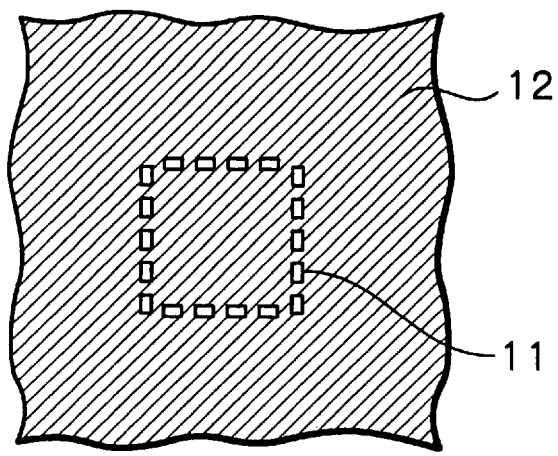
FIGS. 5A, 5B and 5C are plan views illustrating first, second and third embodiments of the accessory pattern according to the present invention.
Figure 5B:
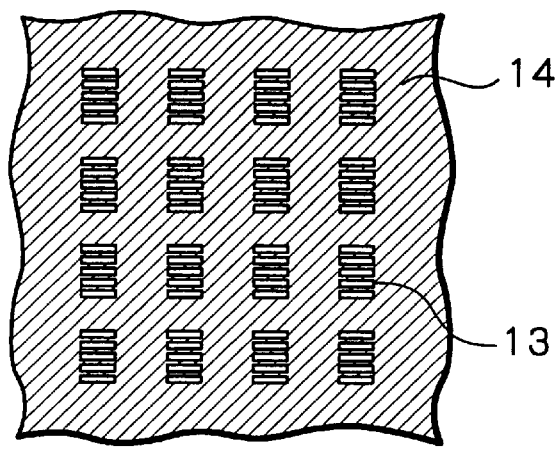
Figure 5C:
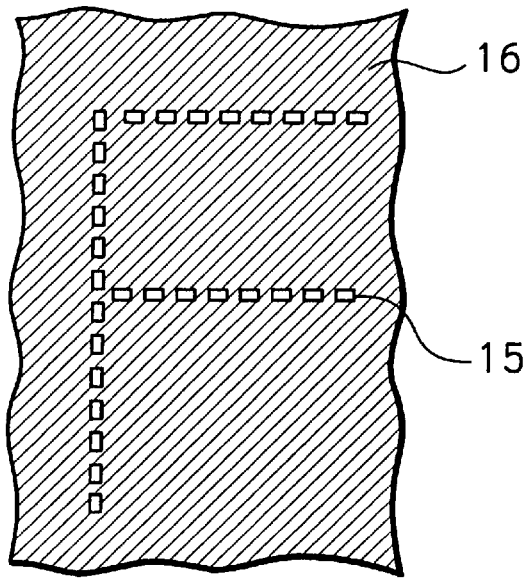

FIGS. 5A, 5B and 5C are plan views of first, second and third embodiments, respectively, of the accessory pattern according to the present invention. The accessory patterns of FIGS. 5A, 5B and 5C correspond to the accessory patterns of FIGS. 2A, 2B and 2C, respectively. Each of the patterns is formed by arranging a plurality of small rectangular minor patterns, i.e., sub-patterns as so many units, each having a width not exceeding 1 $\mu$m, at intervals separating them from one another.

In FIG. 5A, the accessory pattern is an alignment-accuracy gauging pattern formed by a light transmitting region 11 and a light shield region 12 surrounding the rectangular light transmitting region 11. The light transmitting region 11 is constructed by a plurality of rectangular minor patterns (sub-patterns) arranged at intervals separating them from one another to form the profile of a square whose sides are defined by the sub-patterns. When gauging the accuracy of alignment of a semiconductor device by means of such a pattern, the latter, which is square as a whole, is compared with an alignment-accuracy gauging pattern produced in a preceding step to evaluate the accuracy of alignment.

In FIG. 5B, the accessory pattern is an alignment mark formed by a plurality of rectangular light transmitting regions 13 and a light shield region 14 surrounding the rectangular light transmitting regions 13. Each of the rectangular light transmitting regions 13 is constructed by five rectangular minor patterns (sub-patterns) of equal length and arranged to extend transversally with appropriate intervals substantially equal to their width. The rectangular light transmitting regions 13 are arranged to form a matrix with appropriate vertical and transversal intervals.

When aligning a semiconductor device in a subsequent step by means of such an alignment mark, a laser beam having a specific wavelength is made to irradiate the alignment mark and the location of the pattern is identified by detecting the diffracted laser beam. Alternatively, the alignment mark is picked up as an image by means of rays of light after removing those used for exposure, and the location of the pattern is identified by observing the contrast of the image.

In FIG. 5C, the accessory pattern is a dimension gauging pattern formed by an F-shaped light transmitting region 15 and a light shield region 16 surrounding the F-shaped light transmitting ergion 15. The F-shaped light transmitting region 15 is constructed by a plurality of rectangular oblong minor patterns (sub-patterns) arranged at intervals separating them from one another to form the letter F. The rectangular minor patterns are formed by cutting a photoresist layer to produce a plurality of recesses.

Note that the letter F of the dimension gauging pattern does not have any specific meaning except that it is used simply as a pattern for gaugng the mask dimensions, and thus the pattern may be in the form of any other profile. The dimension gauging pattern for gauging the dimensions of the mask is used to determine the smallest possible dimensions of the mask and is conventionally formed from a continuous opening (recess) with a width equal to that of the smallest slit pattern section of the mask pattern.

While a prior art accessory pattern may have the smallest possible width, it does not have a length corresponding to a continuous opening, and therefore, such a prior art accessory pattern having an oblong profile is liable to break down. On the other hand, in the above-mentioned embodiments, rectangular sub-patterns are used as unit and each of the sub-patterns has a small width and a short length, so that the accessory pattern is not liable to break down.

Each of the accessory patterns of FIGS. 5A, 5B and 5C has a width of 1 micrometer, which is almost the same as the capacitor size of the cell section.

An embodiment of the method for manufacturing a cylindrical stacked capacitor type DRAM cell according to the present invention using the alignment-accuracy gauging pattern of FIG. 5A is explained next with reference to FIGS. 6A through 6I, 7A and 7B. In each of FIGS. 6A through 6I, the left view indicates an accessory section located in the dicing area 100 of FIG. 1 and the right view indicates a cylindrical stacked capacitor memory cell section in the chip area 200 of FIG. 1.

Figure 6A:
Figure 7A:
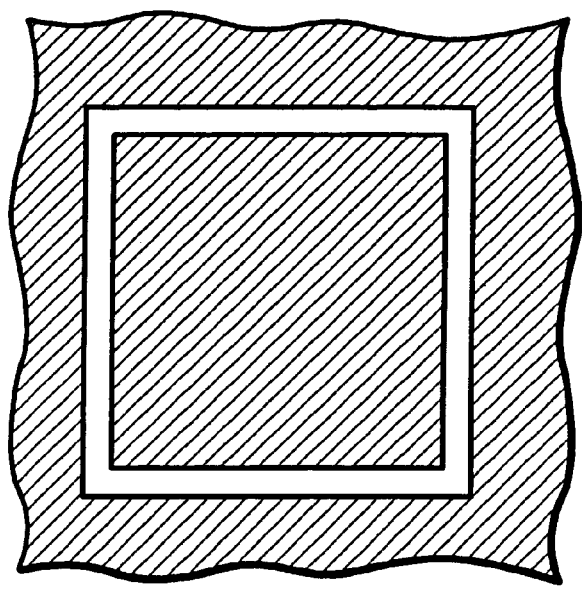
FIGS. 7A and 7B are plan views of reticles used in the steps of FIGS. 6A and 6B, respectively.

First, referring to FIG. 6A, in the same way as in FIG. 3A, a field silicon oxide layer and a gate silicon oxide layer (not shown) are grown by thermally oxidizing a P-type monocrystalline silicon substrate 1. Then, a polycrystalline silicon layer is deposited by a CVD process, and the polycrystalline silicon layer is patterned by a photolithography and etching process to obtain a gate electrode layer 2. Then, N-type impurities are implanted into the silicon substrate 1 in self-alignment with the gate electrode layer 2 to form source/drain diffusion regions (not shown) within the silicon substrate 1. Then, a silicon oxide layer 3 is depositied on the entire surface by a CVD process. Then, a strip-like opening OP1 and a contact hole CONT are formed in the accessory section and the cell section, respectively, of the silicon oxide layer 3. In this case, the strip-like opening OP1 is formed by a photolithography process using an alignment-accuracy gauging pattern reticle as illustrated in FIG. 7A. Then, a polycrystalline silicon layer is deposited on the entire surface by a CVD process, and the polycrystalline silicon layer is etched back. As a result, an alignment-accuracy gauging pattern layer 4a and a contact plug 4b are buried in the strip-like opening OP1 and the contact hole CONT, respectively, of the silicon oxide layer 3.

Figure 6B:
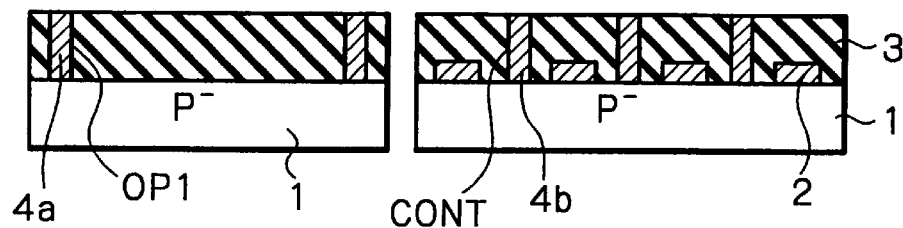
Figure 7B:
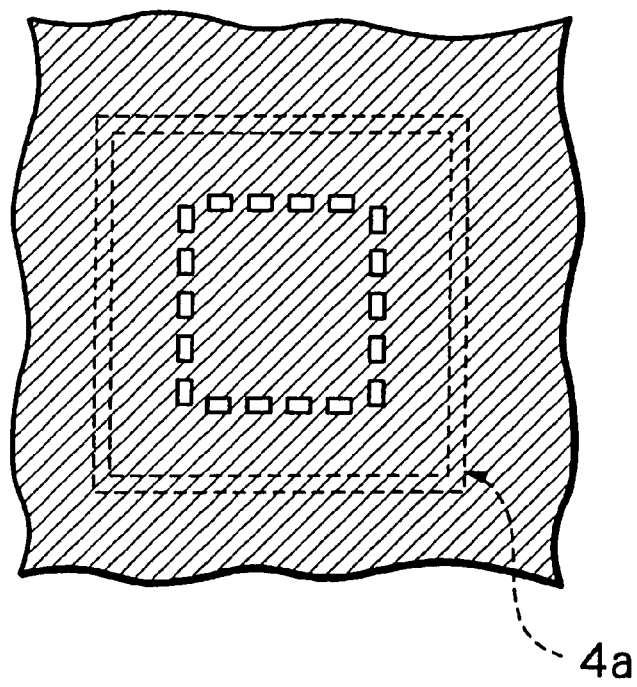

Next, referring to FIG. 6B, in a similar way to that of FIG. 3B, an about 50 nm thick silicon nitrate layer 5 is deposited on the entire surface by a CVD process, and an about 700 nm thick doped silicon oxide layer 6 made of BPSG is deposited on the silicon nitride layer 5 by a CVD process. Note that the silicon nitride layer 5 serves as an etching stopper when the doped silicon oxide layer 6 is etched by a wet etching process. Then, a positive-type photoresist layer 7 is coated and patterned by a photolithography process. Note that the positive-type photoresist layer 7 can be dissolved into a developing solution when irradiated with light. In this case, the photoresist layer 7 is patterned by a photolithography process using an alignment-accuracy gauging pattern reticle as illustrated in FIG. 7B, which is the same as FIG. 5A. For the alignment operation of the reticle of FIG. 7B, the alignment-accuracy gauging pattern layer 4a is used.

As explained above, the alignment-accuracy gauging pattern of FIG. 7B (FIG. 5A) has openings arranged at regular intervals to form a square as a whole, each of the openings having a rectangular profile with a size corresponding to that of the capacitor in the cell section.

Figure 6C:
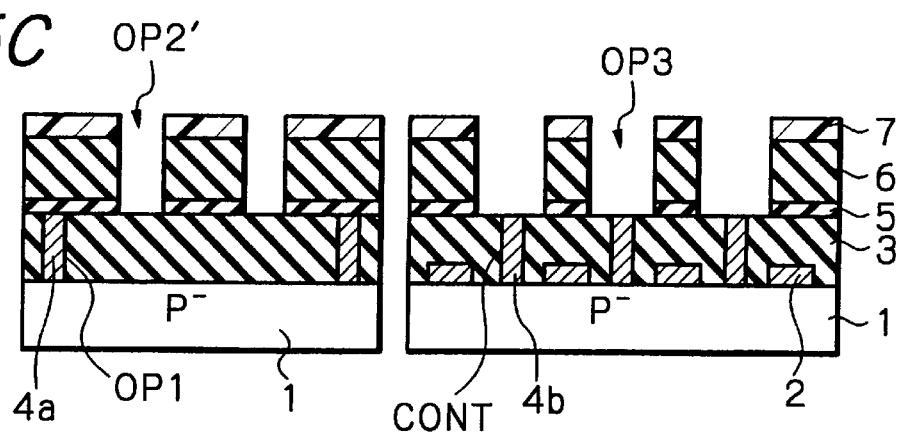

Next, referring to FIG. 6C, in the same way as in 3C, the doped silicon oxide layer 6 is etched by a dry etching process using fluorocarbon gas such as $CF_4$ or $CHF_3$ and the photoresist layer as a mask. Then, the silicon nitride layer 5 is further etched by a dry etching process using fluorocarbon gas such as $CF_4$ or $CHF_3$ to expose the silicon oxide layer 3. As a result, openings OP2' are formed in the silicon nitride layer 5 and the doped silicon oxide layer 6 of the accessory section, and openings OP3 are formed in the silicon nitride layer 5 and the doped silicon oxide layer of the cell section. Then, the photoresist layer 7 is removed.

Next, referring to FIG. 6D, in the same way as in FIG. 3D, an about 100 nm thick polycrystalline silicon layer 8 is deposited on the entire surface by a CVD process. In this case, the thickness of the polycrystalline silicon layer 8 is so small that the polycrystalline silicon layer 8 covers the openings OP2' and OP3.

Next, referring to FIG. 6E, in the same way as in FIG. 3E, an organic or inorganic layer 9 is coated on the entire surface, so that the organic or inorganic layer 9 is buried into the openings OP2' and OP3 of the accessory section an the cell section, respectively. In this case, since the opening OP2' and OP3 in the accessory section and the cell section, respectively are sufficiently small, the surface of the organic or insulting layer is flattened.

Note that the organic or inorganic layer 9 is made of SOG or a photoresist material.

Next, referring to FIG. 6F, in the same way as in FIG. 3F, the organic or inorganic layer 9 is etched back by a dry etching process using fluorocarbon gas such as $CF_4$ or $CHF_3$ to expose the polycrystalline silicon layer 8. In this case, since the opening OP2' in the accessory section serving as the accessory pattern has a size of 0.2 to 1 micrometers, which is almost the same as that of the capacitor size of 0.2 to 1 micrometers, an organic or inorganic layer 9a' will practically remain in the opening 0P2'. On the other hand, the opening 0P3 in the cell section, which is a polygonal recess whose sides have a length corresponding to the capacitor size of 0.2 to 1 micrometers, has only a small area, an organic or inorganic layer 9b remains to a considerable extent in the opening 0P3. The organic or inorganic layers 9a' and 9b serve as a protection layer for preventing the polycrystalline silicon layer 8 from being etched back.

Figure 6G:
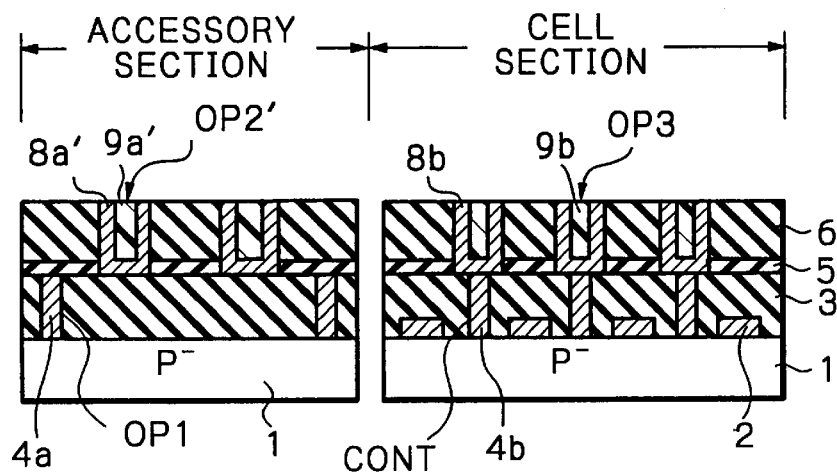

Next, referring to FIG. 6G, in the same way as in FIG. 3G, the polycrystalline silicon layer 8 is etched back by using chlorine gas. As a result, a U-shaped polycrystalline silicon layer 8a' in the accessory section remains on the sidewall of the silicon nitride layer 5 doped silicon oxide layer 6 within the opening 0P2'. On the other hand, a U-shaped polycrystalline silicon layer 8b in the cell section remains in the opening 0P3 to form a lower capacitor electrode.

Figure 6H:
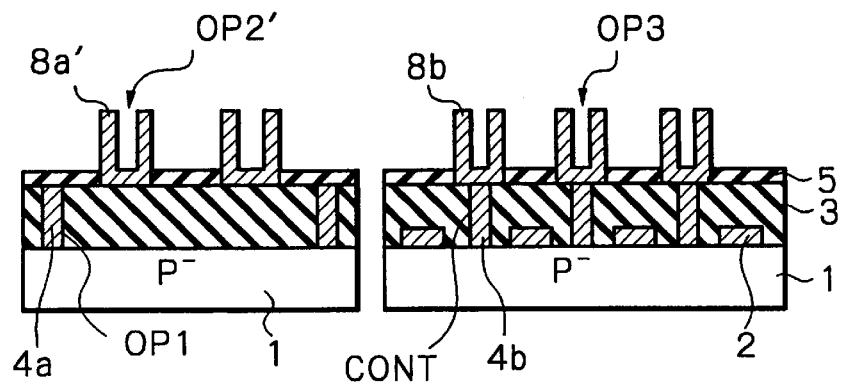

Next, referring to FIG. 6H, in the same way as in FIG. 3H, the organic or inorganic layers 9a' and 9b in the openings 0P2' and 0P3 and the doped silicon oxide layer 6 are removed by a wet etching process using fluoric acid while the silicon nitride layer 5 serves as an etching stopper.

Figure 6I:
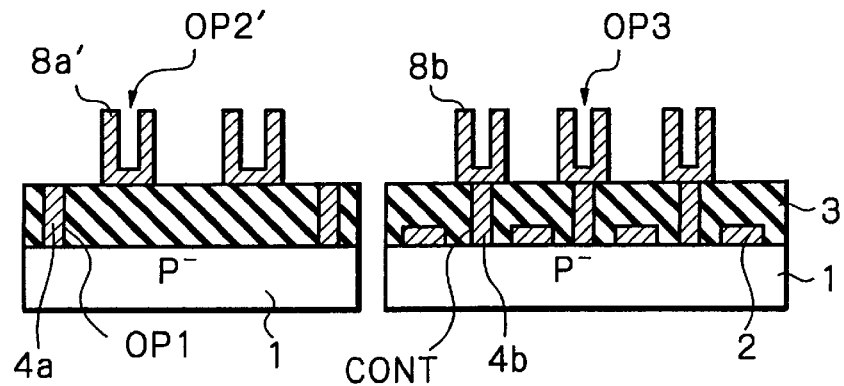

Finally, referring to FIG. 6I, in the same way as in FIG. 3I, the silicon nitride layer 5 is removed by a dry etching process using fluorocarbon gas such as $CF_4$ or $CHF_3$.

In the manufacturing method as illustrated in FIGS. 6A through 6I, when the wet etching process for etching the organic or inorganic layers 9a' and 9b and the doped silicon layer 6 as illustrated in FIG. 6H is used, the silicon oxide layer 3 in the accessory section is not etched, due to the presence of the silicon nitride layer 5. As a result, as illustrated in FIG. 6I, the polycrystalline silicon layer 8a' does not lift or peel off.

Figure 8:
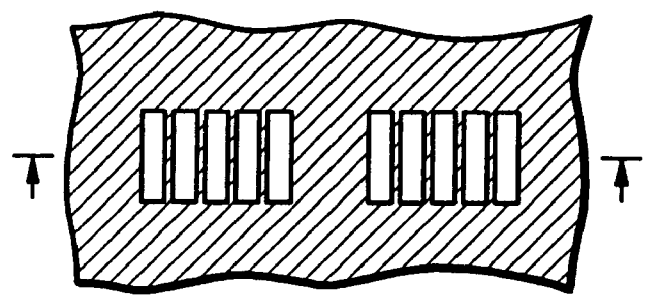
FIG. 8 is a cross-sectional view of a semiconductor device manufactured by using the accessory pattern of FIG. 5B.
Figure 8:
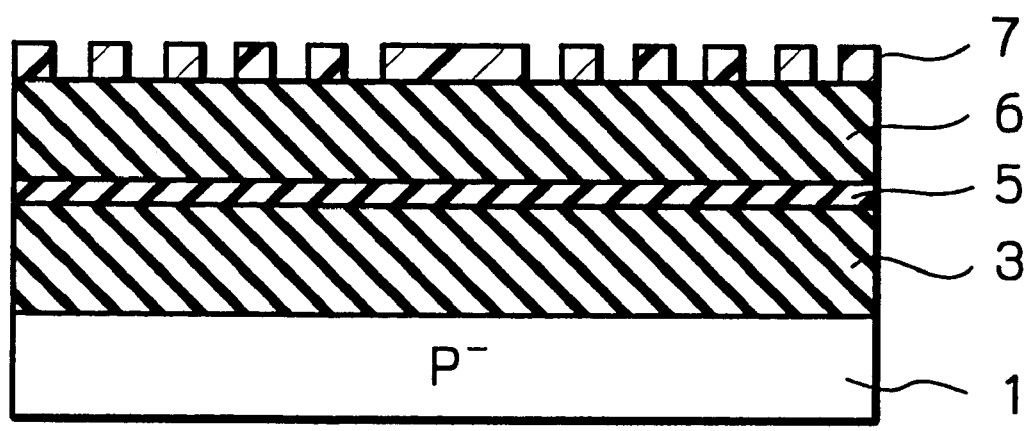

FIG. 8 is a cross-sectional view of a semiconductor device by using the accessory pattern of FIG. 5B. In FIG. 8, which corresponds to FIG. 6B, the alignment-accuracy gauging pattern layer 4a of FIG. 4B is not provided, and the photoresist layer 7 is patterned by a photolithography process using a reticle having the alignment mark pattern as illustrated in FIG. 5B. Similarly, a semiconductor device can be manufactured by using the accessory pattern of FIG. 5C. Also, in this case, the alignment-accuracy gauging pattern layer 4a of FIG. 4B is not provided, and the photoresist layer 7 is patterned by a photolithography process using an alignment mark patern reticle as illustrated in FIG. 5C.

Figure 9A:
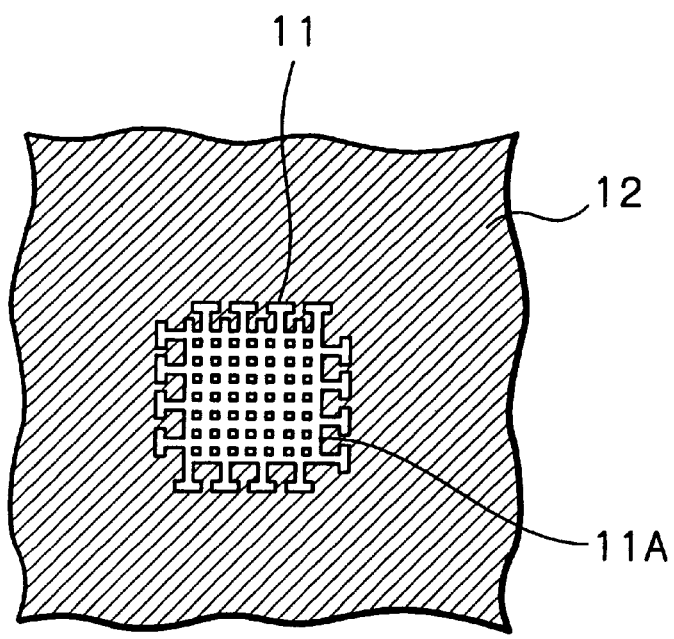
FIGS. 9A and 9B are plan views illustrating fourth and fifth embodiments, respectively, of the accessory pattern according to the present invention.
Figure 9B:
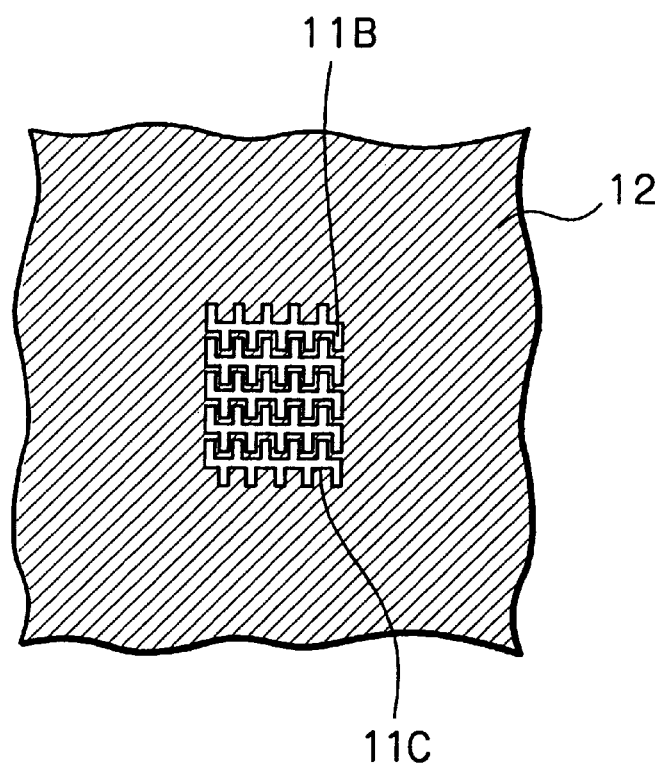

In FIGs. 9A and 9B, which are plan views illustrating fourth and fifth embodiments, respectively, of the accessory pattern according to the present invention, the accessory patterns are alignment-accuracy gauging patterns.

The alignment-accuracy gauging pattern of FIG. 9A differs from that of FIG. 5A in that, in addition to a plurality of rectangular oblong patterns (sub-patterns) 11 form the profile of a square like those of the alignment-accuracy gauging pattern of FIG. 5A, there are formed strip-shaped patterns (sub-patterns) 11A, each extending between a pair of oppositely disposed rectangular patterns 11 of the square and having a width not greater that 1μm. The strip-shaped patterns (sub-patterns) 11A also serve as a light transmitting region. With this arrangement, a pair of strip-shaped patterns 11A running rectangularly relative to each other form a cross.

Therefore, when a semiconductor device is manufactured by using a reticle having the alignment-accuracy gauging pattern of FIG. 9A, a strip-shaped polycrystalline silicon layer having an U-shaped cross section is connected to lateral surfaces of other strip-shaped polycrystalline silicon layers having a U-shaped cross section, to form the profile of a square. Additionally, these polycrystalline silicon layers form an interwoven network within the square. Note that the portion of the pattern that is indispensable for gauging the accuracy of alignment is the rectangular sub-patterns 11 forming the profile of a square and the patterns 11A of the network of strip-shaped polycrystalline silicon layers arranged within the square are used only to support the rectangular sub-patterns 11, thus improving the mechanical strength.

The alignment-accuracy gauging pattern in FIG. 9B differs from that of FIG. 5A in that it includes rectangular oblong patterns (sub-patterns) 11B arranged longitudinally over the entire surface of the square to form a matrix, and the rectangular patterns 11B on each row are connected by a long strip-shaped patterns (sub-patterns) 11C. Additionally, the rectangular patterns 11B of each row are arranged in a staggered fashion by vertical slight displacement of two adjacent rectangular patterns 11B.

Also, in FIG. 9B, note that the portion of the pattern that is indispensable for gauging the accuracy of alignment as an alignment-accuracy gauging pattern is only those of the rectangular sub-patterns 11B forming the profile of a square, and that the remaining rectangular oblong patterns 11B linked to those forming the profile of the square of the alignment-accuracy gauging pattern 11B and the striped-shaped patterns 11C are used only to support the rectangular oblong sub-patterns of the alignment-accuracy gauging pattern 11C, thus improving their mechanical strength.

Figure 10:
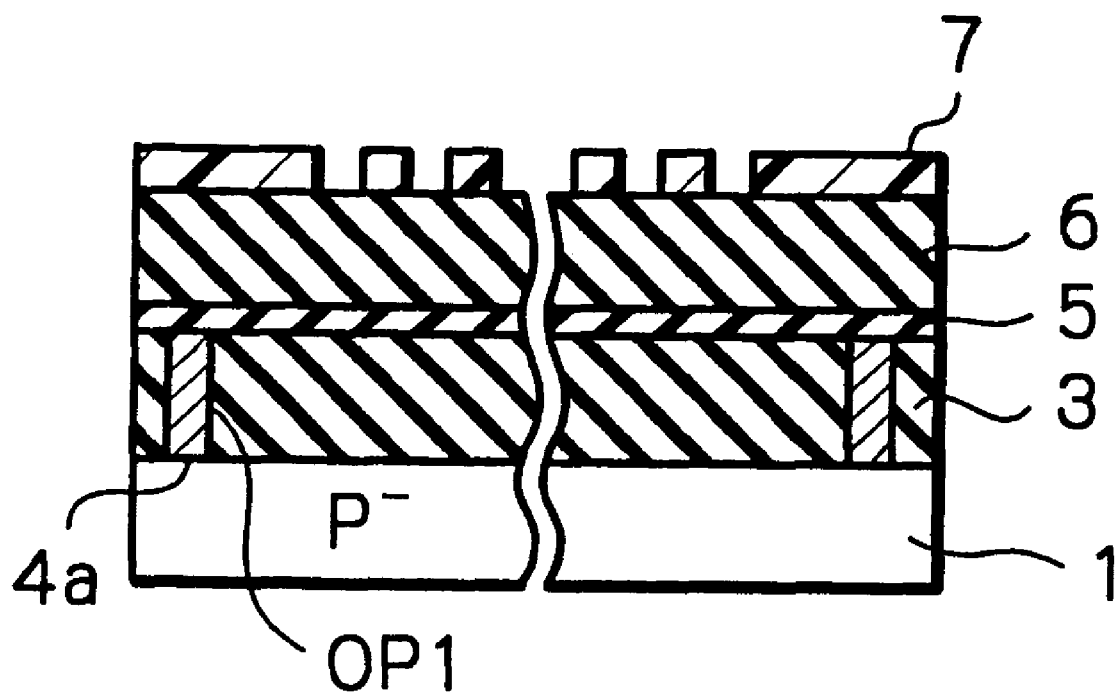
FIG. 10 is a cross-sectional view of a semiconductor device by using the accessory pattern of FIG. 9A.

FIG. 10 is a cross-sectional view of a semiconductor device using the accessory pattern of FIG. 9A. In FIG. 10, which corresponds to FIG. 6B, the photoresist layer 7 is patterned by a photolithography process using a reticle having the alignment mark pattern as illustrated in FIG. 9A.

As described aboce, the alignment-accuracy gauging pattern of FIG. 9A containes not only the rectangular sub-patterns 11 for forming a square alignment-accuracy gauging pattern but also the strip sub-patterns 11A for supporting the rectangular sub-patterns 11. Similarly, the alignment-accuracy gauging pattern of FIG. 9B contains not only rectangular sub-patterns 11B for forming a square alignment-accuracy gauging pattern but also the strip-shaped sub-patterns 11C for supporting the rectangular sub-patterns 11B. Therefore, all the sub-patterns used for forming the alignment-accuracy gauging pattern can be made to form a size of several micrometers to tens of several micrometers, to consequently increase the ratio of the contact area of sub-pattern and its underlying layer to the total area of the sub-patterns. As a result, tha chances of peeling-off polycrystalline silicon can be reduced without increasing the number of manufacturing steps if the polycrystalline silicon is patterned by means of an accessory pattern better than the pattern of FIG. 5A.

Note that while each of FIGS. 9A and 9B shows an alignment-accuracy gauging pattern that can be used for the pattern of an accessory section, either of the patterns of FIGS. 9A and 9B can be applied to an alignment mark or a dimension-gauging pattern.

In the above-described embodiments, while the sub-patterns of the accessory pattern of a reticle are formed in a light transmitting region, the sub-patterns may alternatively be formed in a light shield region. If such is the case, a negative photoresist that is dissolved in a developing solution in areas not exposed to light will be used for forming openings corresponding to the sub-patterns.

Figure 11A:
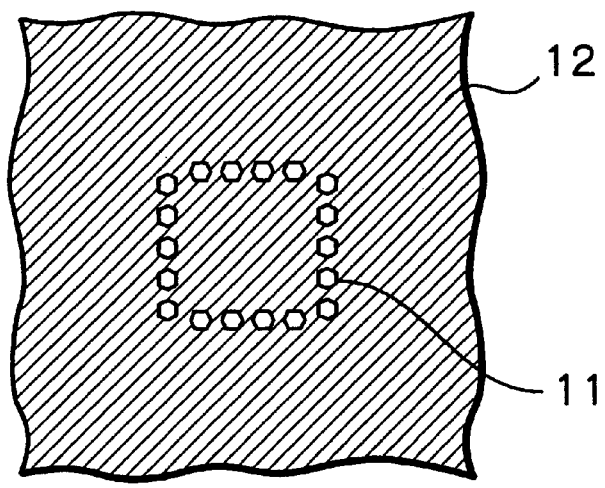
FIGS. 11A, 11B and 11C are pan views of modifications of FIG. 5A.
Figure 11B:
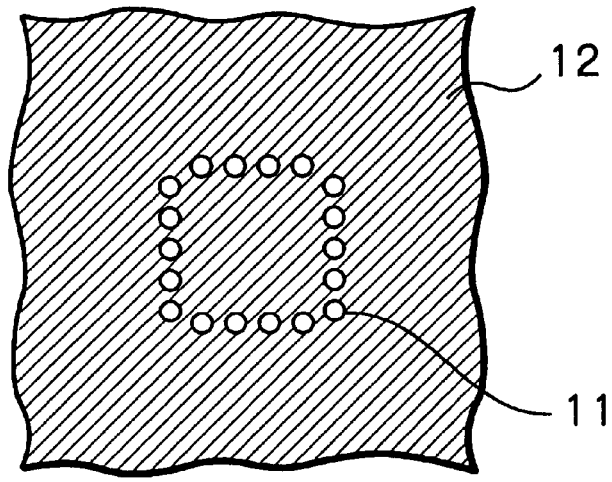
Figure 11C:
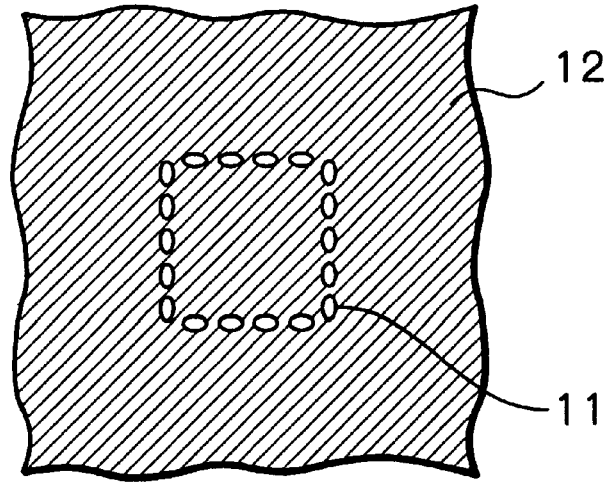

Also, while an alignment mark, an alignment-accuracy gauging pattern or a dimension gauging pattern comprises rectangular sub-patterns in the above-described embodiments, the sub-patterns may alternatively have a polygonal profile other than a rectangular profile such as a square profile or a circular or elliptic profile for the purpose of the present invention, as illustrated in FIGS. 11A, 11B and 11C.

Further, an alignment pattern, an alignment-accuracy gauging pattern or a dimension gauging pattern as illustrated in FIGS. 5A, 5B, 5C, 9A and 9B may comprise any sub-patterns that operate as such when combined together.

Additionally, while each of the sub-patterns of the accessory pattern has a size that can be contained within a 1 μm wide strip in the above-described embodiments each sub-pattern is required only to be smaller than the smallest size of the principal pattern of the chip area. From a functional viewpoint, the sub-patterns may be of any size with which a coated layer can be buried into the openings corresponding to the sub-patterns to flatten the surface of the coated layer.

Still further, while the alignment mark, the alignment-accuracy gauging pattern of the dimension gauging pattern is in the form of a square, rectangular or F-shaped profile in the above-described embodiments, the present invention is by no means limited thereto and may alternatively be in the form of another appropriate profile.

As explained hereinabove, in a reticle according to the present invention, an accessory pattern is produced by a plurality of sub-patterns prepared by dividing the accessory pattern of a light shield region or a light transmitting region into a plurality of light shield regions or a plurality of light transmitting regions, whichever appropriate, of smaller areas, so that the entire accessory pattern has a size of several to tens of several micrometers and is large relative to the minimum pattern of the chip pattern. Therefore, the accessory pattern can be divided into sub-patterns having a size that can be selected appropriately.

When the cell section of a cylindrical stack capacitor is formed by using a reticle according to the present invention, an accessory pattern of considerably large width, and hence which cannot be used to bury a sugnificantly thick layer by means of an coating technique, can be divided into sub-patterns having a satisfactorily small width and a satisfactory thickness in order that it can be buried into the opening that corresponds to the sub-patterns according to the present invention. Therefore, a conductive layer that is buried in the opening and used for forming the cylindrical capacitor can be left intact by using the coated layer as a protection layer for etching the material of the conductive layer to be used for forming the cylindrical capacitor.

Thus, when compared with the prior art method, the method of the present invention provides a conductive layer for the cylindrical capacitor that is held in close contact with the underlying layer over an increased area and therefore made to strongly and tightly adhere to the latter. In particular, a layer to be patterned having a U-shaped cross section can be formed as a continuous layer by connecting isolated sub-patterns, to some other sub-patterns so that the area of contact of the layer with the underlying layer can be further increased and thereby improve the adherence of the two layers. As a result, the chances of peeling off conductive layers can be reduced without increasing the number of manufacturing steps.

What is claimed is:

1. A reticle for transferring a pattern onto a photosensitive layer by a photolithography process, said reticle comprising:
   a principal pattern; and
   an accessory pattern which comprises a set of sub-patterns, each of said sub-patterns having a largest dimension corresponding to a smallest dimension of said principal pattern.

2. The reticle as set forth in claim 1, wherein said accessory pattern comprises an alignment-accuracy gauging pattern.

3. The reticle as set forth in claim 1, wherein said accessory pattern comprises an alignment mark.

4. The reticle as set forth in claim 1, wherein said accessory pattern comprises a dimension gauging pattern.

5. The reticle as set forth in claim 1, wherei said sub-patterns are provided in a light transmitting region of said reticle.

6. The reticle as set forth in claim 1, wherein said sub-patterns are provided in a light shield region of said reticle.

7. The reticle as set forth in claim 1, wherein said sub-patterns have a width of about 1 μm.

8. The reticle as set forth in claim 1, wherein each of said sub-patterns comprises a minimum pattern of said principle pattern.

9. The reticle as set forth in claim 1, wherein each of said sub-patterns is polygonal.

10. The reticle as set forth in claim 1, wherein each of said sub-patterns is circular.

11. The reticle as set forth in claim 1, wherein each of said sub-patterns is elliptical.

12. The reticle as set forth in claim 1, wherein said sub-patterns are arranged at intervals separating said sub-patterns from each other, so as to form a profile of said accessory pattern.

13. The reticle as set forth in claim 1, wherein said sub-patterns are arranged at intervals separating said sub-patterns from each other, so as to be distributed horizonally and vertically within an area of said accessory pattern.

14. The reticle as set forth in claim 1, wherein said sub-patterns are arranged at intervals separating said sub-patterns from each other, so as to be aligned to form said accessory patterns.

15. The reticle as set forth in claim 1, wherein some of said sub-patterns are connected to each other.

16. The reticle as set forth in claim 1, wherein said principal pattern is a cylindrical capacitor of a dynamic random access memory.

17. The reticle as set forth in claim 1, wherein each of said sub-patterns has a largest dimension that is no more than 1 μm.

18. The reticle as set forth in claim 1, wherein each of said sub-patterns forms one of a light-transmitting region and light-shielding region.

19. The reticle as set forth in claim 1, wherein said accessory pattern surrounds said principal pattern.

20. The reticle as set forth in claim 1, wherein said accessory pattern comprises an alignment-accuracy gauging pattern having a first set of said sub-patterns for gauging an accuracy of alignment and a second set of said sub-patterns for supporting said first set of said sub-patterns.

21. The reticle as set forth in claim 1, wherein said sub-patterns are continuously arranged.

22. The reticle as set forth in claim 1, wherein said accessory pattern comprises:
   a light transmitting region; and
   a light shield region surrounding said light transmitting region.

23. The reticle as set forth in claim 1, wherein said accessory pattern comprises:
   a plurality of light transmitting regions; and
   a light shield region surrounding said plurality of light transmitting regions.

24. The reticle as set forth in claim 1, wherein a first set of said sub-patterns are rectangular and form a profile of a square and a second set of said sub-patterns are strip-shaped and extend between a pair of oppositely disposed retangular sub-patterns.

25. The reticle as set forth claim 1, wherein a first set of said sub-patterns are rectangular and are arranged longitudinally over an entire surface of a square form a matrix and are connected by a second set of said sub-patterns which are strip-shaped.

* * * * *